US012669675B2

(12) United States Patent
Zaczek et al.

(10) Patent No.: US 12,669,675 B2
(45) Date of Patent: Jun. 30, 2026

(54) METHOD FOR PRODUCING A MIRROR OF A LITHOGRAPHY SYSTEM

(71) Applicant: Carl Zeiss SMT GmbH, Oberkochen (DE)

(72) Inventors: Christoph Zaczek, Heubach (DE); Erik Loopstra, Huernheim (DE); Eric Eva, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 68 days.

(21) Appl. No.: 18/474,561

(22) Filed: Sep. 26, 2023

(65) Prior Publication Data

US 2024/0027730 A1 Jan. 25, 2024

Related U.S. Application Data

(63) Continuation of application No. PCT/EP2022/056930, filed on Mar. 17, 2022.

(30) Foreign Application Priority Data

Apr. 8, 2021 (DE) .......................... 102021203470.5

(51) Int. Cl.
*G02B 7/18* (2021.01)
*G02B 5/08* (2006.01)
*G03F 7/00* (2006.01)

(52) U.S. Cl.
CPC ......... *G02B 7/1815* (2013.01); *G02B 5/0891* (2013.01); *G03F 7/70316* (2013.01); *G03F 7/70891* (2013.01)

(58) Field of Classification Search
CPC ............. G03F 7/70891; G03F 7/70316; G03F 7/70958; G02B 7/1815; G02B 5/0891; G02B 5/10
See application file for complete search history.

(56) References Cited

U.S. PATENT DOCUMENTS 4,409,278 A * 10/1983 Jochym ............... C04B 35/6303
228/198
9,945,993 B2 * 4/2018 Aono ................. B29D 11/0048
(Continued)

FOREIGN PATENT DOCUMENTS

DE 10 2019 217 530 A1 12/2019
DE 10 2020 208 648 A1 1/2022
(Continued)

OTHER PUBLICATIONS

International Search Report and Written Opinion for corresponding PCT Appl No. PCT/EP2022/056930, dated Jul. 5, 2022.
(Continued)

*Primary Examiner* — Steven H Whitesell
(74) *Attorney, Agent, or Firm* — Fish & Richardson P.C.

(57) ABSTRACT

A method for producing a mirror of a lithography system includes providing first and second mirror parts. Cooling channels having elongate cooling channel openings in the region of a first connecting surface of the first mirror part are formed in the first mirror part, and/or cooling channels having elongate cooling channel openings in the region of a second connecting surface of the second mirror part are formed in the second mirror part. The method also includes bringing together the first and second mirror parts so that initially a partial region of the first connecting surface and a partial region of the second connecting surface come into contact and form a common contact surface. The common contact surface is enlarged by continuing to bring the first and second mirror parts together in a direction along the longitudinal extents of the cooling channel openings.

20 Claims, 6 Drawing Sheets

(56)     References Cited

U.S. PATENT DOCUMENTS

| | | | | |
|---|---|---|---|---|
| 2003/0016447 A1* | 1/2003 | Kato | ................... | G02B 5/1857 |
| | | | | 359/569 |
| 2006/0286710 A1* | 12/2006 | Sugita | ..................... | G02B 6/13 |
| | | | | 438/455 |
| 2007/0091485 A1* | 4/2007 | Phillips | .............. | G03F 7/70983 |
| | | | | 359/857 |
| 2009/0122428 A1* | 5/2009 | Phillips | ................. | G02B 7/181 |
| | | | | 359/846 |
| 2009/0122429 A1 | 5/2009 | Watson et al. | | |
| 2011/0217795 A1* | 9/2011 | Tanida | ................. | G02F 1/1303 |
| | | | | 29/729 |
| 2017/0315453 A1* | 11/2017 | Bauer | ................ | G03F 7/70266 |
| 2018/0239252 A1* | 8/2018 | Nienhuys | ........... | G03F 7/70891 |
| 2020/0094487 A1* | 3/2020 | Wahl | .................. | B29C 66/0246 |

FOREIGN PATENT DOCUMENTS

| | | |
|---|---|---|
| EP | 2678287 B1 | 11/2018 |
| WO | WO2022008155 A1 | 1/2022 |

OTHER PUBLICATIONS

Office Action in German Appln. No. 10 2021 203 470.5, mailed on Oct. 20, 2021, 6 pages (with English translation).
Office Action in Japanese Appln. No. 2023-561882, mailed on Mar. 31, 2026, 8 pages (with English translation).

\* cited by examiner

17

14

13

18, 19

25

26, 27

METHOD FOR PRODUCING A MIRROR OF A LITHOGRAPHY SYSTEM

CROSS-REFERENCE TO RELATED APPLICATIONS

The present application is a continuation of, and claims benefit under 35 USC 120 to, international application PCT/EP2022/056930, filed Mar. 17, 2022, which claims benefit under 35 USC 119 of German Application No 10 2021 203 470.5, filed Apr. 8, 2021. The entire disclosure of each these applications is incorporated by reference herein.

FIELD

The disclosure relates to a method for producing a mirror of a lithography system. The disclosure furthermore relates to a mirror of a lithography system, to an illumination system, to a projection lens and to a lithography system.

BACKGROUND

Lithography systems are used in particular in the production of semiconductors and generally have an illumination system and a projection lens. The illumination system generates from the light of a light source a desired light distribution for the illumination of a mask, which is often also referred to as a reticle. Light should be understood in this case in the general sense of electromagnetic radiation, i.e. there is no restriction as to a specific wavelength. Accordingly, the terms "light" and "radiation" will be used synonymously below, i.e. a light source may also be referred to as a radiation source, a light distribution may also be referred to as a radiation distribution and so on. Using the projection lens, the mask is imaged onto a light-sensitive material, which is for example applied to a wafer or another substrate, in particular of a semiconductor material. In this way, the light-sensitive material is exposed in a structured manner to a pattern prescribed by the mask. Since the mask has tiny structure elements that are intended to be transferred to the substrate with high precision, it is desirable for the illumination system to generate a desired light distribution relatively precisely and relatively reproducibly and for the imaging by the projection lens to take place relatively precisely and relatively reproducibly.

In addition to further optical elements, the illumination system and the projection lens may have in the light path at least one mirror, which deflects the light in a specified way by reflection at its optical surface. How the light deflection specifically takes place generally depends on the shape of the optical surface. The optical surface may for example be formed as a metallic layer or as a series of layers with alternating refractive indices.

Since, in general, the mirror does not reflect completely but can absorb a portion of the light and can convert it into heat, the mirror can heat up during operation. This increase in temperature can result in a deformation of the optical surface of the mirror and thereby can influence the light deflection at the optical surface. If the mirror is an integral part of the illumination system, the light distribution generated by the illumination system can deviate from the specification in the case of a deformation of the optical surface of the mirror. If the mirror is an integral part of the projection lens, imaging aberrations can occur during the imaging using the projection lens if the optical surface of the mirror is deformed.

With increasing miniaturization in semiconductor manufacturing, it is desirable for the illumination and the imaging of the mask to be carried out with ever increasing precision. The result can be that an increasing number of influencing factors are taken into account, which it has so far been generally possible to tolerate, or that already existing measures for compensating the influencing factors are desirably improved or be substituted by better measures.

It is already known to counteract the heating of a mirror of a lithography system by way of cooling the mirror. For example, DE 102020208648.6, which has not been previously published, discloses a mirror having a mirror body, which comprises a first mirror part, a second mirror part, an optical surface for the reflection of light and a plurality of cooling channels.

When using mirrors that are formed from multiple parts, it can be challenging to connect the individual mirror parts in such a way that meets the high desired properties for lithographic optical parts. For example, connecting the mirror parts can carry the risk that air or some other gas is enclosed between the mirror parts, which can reduce the strength of the connection, for example. In addition, gas inclusions can negatively influence the interferometric measurement of the mirror. Furthermore, gas inclusions can cause a deformation of the optical surface of the mirror, which may depend on the ambient pressure and/or the temperature of the gas that is enclosed. There can be the additional risk that gas that has dissolved in the material of the mirror can accumulate in the region of the gas inclusions over time and that the enclosed gas volumes can consequently increase and their negative effects likewise increase. In addition, local stresses caused by the gas inclusions can cause drift movements in the region of the connection of the mirror parts, which in turn may result in a deformation of the optical surface of the mirror.

SUMMARY

The disclosure seeks to simplify the production of a mirror of a lithography system and in particular to allow the connection of two mirror parts with a relatively high level of precision and reproducibility. Gas inclusions between the mirror parts are intended to be prevented or at least to be reduced to an acceptable level.

In a method according to the disclosure for producing a mirror of a lithography system, a first mirror part and a second mirror part are provided, wherein cooling channels having elongate cooling channel openings in the region of a first connecting surface of the first mirror part are formed in the first mirror part and/or cooling channels having elongate cooling channel openings in the region of a second connecting surface of the second mirror part are formed in the second mirror part. The first mirror part and the second mirror part may be brought together in such a way that initially a partial region of the first connecting surface and a partial region of the second connecting surface come into contact and form a common contact surface, and the common contact surface is enlarged by continuing to bring the first mirror part and the second mirror part together in a direction along the longitudinal extents of the cooling channel openings.

A method according to the disclosure can simplify the production of a mirror of the lithography system and two mirror parts can be connected together with a relatively high level of precision and reproducibility. Using a method according to the disclosure, the second mirror part can be optically contact bonded to the first mirror part in a relatively highly controlled manner, i.e., be connected to the first mirror part due to Van der Waals forces between the material of the second mirror part and the material of the first mirror part in the region of the common contact surface. Gas inclusions between the first connecting surface of the first mirror part and the second connecting surface of the second mirror part can here be largely avoided because the gas can escape along the cooling channel openings. The second mirror part can be continuously supported by the first mirror part as the second mirror part and the first mirror part continue to be brought together.

The transition zone between the common contact surface, within which the second mirror part has already been optically contact bonded onto the first mirror part, and the region of the first and second connecting surfaces that has not been optically contact bonded is also referred to as the optical contact bond front. Continuing to bring together the first mirror part and the second mirror part can have the effect that the optical contact bond front moves in a desired direction in a controlled manner. This successive optical contact bonding means that the relative alignment of the two mirror parts with respect to one another can be controlled relatively accurately during the entire optical contact bonding operation and undesired spontaneous optical contact bonding can be avoided. By moving the optical contact bond front parallel to the cooling channel openings, it is additionally possible to avoid jumps of the optical contact bond front which could be caused by transverse cooling channel openings and to keep the associated risk of discontinuous optical contact bonding and any material stresses caused thereby low. Additionally, at any time point in the optical contact bonding operation there is a connection between the region of the optical contact bond front and the environment, and an escape of the gas from this region can thus be ensured at any time.

Bringing the first mirror part and the second mirror part together can be continued in a direction running at an acute angle with respect to the longitudinal extents of the cooling channel openings. In particular, bringing the first mirror part and the second mirror part together can be continued in a direction parallel to the longitudinal extents of the cooling channel openings. The resulting movement of the optical contact bond front at an acute angle and in particular parallel to the cooling channels facilitates the venting of the intermediate space between the first and the second connecting surface and reduces the risk of gas inclusions.

Before the bringing together of the first mirror part and the second mirror part, the second mirror part can be temporarily connected to a substrate. This can give the second mirror part more mechanical stability during the production of the mirror, which can make handling easier, for example.

With respect to a wavelength λ of 633 nm, the shape of the first connecting surface of the first mirror part and/or the second connecting surface of the second mirror part may deviate from a specified shape by less than $\lambda/2$, such as less than $\lambda/10$. The first connecting surface of the first mirror part and/or the second connecting surface of the second mirror part may have a roughness of less than 5 nm, such as less than 1 nm. The term "roughness" in this case subsumes the randomly distributed deviations from a smooth surface. Precisely shaped and smooth connecting surfaces make optical contact bonding easier, reduce the risk of gas inclusions and increase the load-bearing capacity of the connection. Before the optical contact bonding, one of the two connecting surfaces may be adapted to the actual shape of the other of the two connecting surfaces. In this way, the precision can be increased still further.

The cooling channel openings can extend parallel to one another. In this configuration, the common contact surface between the first mirror part and the second mirror part can initially be formed in a peripheral region of the first connecting surface and the second connecting surface.

It is likewise possible for the cooling channel openings each to extend radially outwardly in one direction from a central location of the first connecting surface of the first mirror part and/or of the second connecting surface of the second mirror part. In this configuration, the common contact surface between the first mirror part and the second mirror part can initially be formed in a central region of the first connecting surface and the second connecting surface.

In one configuration, the clear distance between adjacent cooling channel openings is not more than 15 mm. It is generally desirable for the clear distance between adjacent cooling channel openings to be not more than 5 mm. Small distances between the cooling channel openings can help make venting during optical contact bonding easier.

The transverse dimensions of the cooling channels may be 0.2 to 10 mm. The depth of the cooling channels, i.e. the transverse dimension approximately perpendicular to the first connecting surface of the first mirror part or to the second connecting surface of the second mirror part, may be greater than the width of the cooling channels, i.e. the transverse dimension perpendicular to the depth. In particular, the depth of the cooling channels may be more than twice the width of the cooling channels. As a result, with the same flow cross section, there can be a smaller risk of the optical surface of the mirror deforming, since the proportion of the surface area of the cavities formed by the cooling channels parallel to the optical surface is smaller than in the case of wide cooling channels that have a small depth.

Auxiliary channels that have elongate auxiliary channel openings in the region of the first connecting surface of the first mirror part can be formed in the first mirror part, and/or auxiliary channels that have elongate auxiliary channel openings in the region of the second connecting surface of the second mirror part can be formed in the second mirror part. The auxiliary channels can mean that even regions in which no cooling channels are formed can be reliably vented during the optical contact bonding.

The cooling channel openings and the auxiliary channel openings can have substantially identical orientations at least in pairs. In this way, the auxiliary channels can act as a continuation of the cooling channels.

The auxiliary channels can be formed separately from the cooling channels. The auxiliary channels can be fluidically separate from the cooling channels. As a result, any negative effects on the fluid flow through the cooling channels can be avoided.

The auxiliary channels can furthermore be fluidically connected to the environment of the mirror. This can help make it easier to vent the region between the first mirror part and the second mirror apart during production and can help make pressure equalization with the environment possible in the finished mirror and can help prevent the formation of pressure differences and associated undesirable mechanical effects. Alternatively, it is, however, also possible to separate the auxiliary channels from the environment of the mirror. For example, the auxiliary channels can be separated from the environment of the mirror by way of a flexible membrane. While this can create a fluidic separation, it can permit some coupling of the pressure. In this way, pressure equalization between the interior of the auxiliary channels and the environment of the mirror is possible to some extent. However, it is possible to realize an even stronger separation of the auxiliary channels from the environment, which also brings about decoupling with regards to pressure. In this variant, it is also possible to set in the interior of the auxiliary channels, independently of the ambient pressure, a desired pressure that, for example, can lead to a deformation of the optical surface of the mirror and in this way implements a pressure-controlled manipulator. In general, the separation of the auxiliary channels from the environment of the mirror typically takes place only after the mirror parts have been connected so as not to adversely affect the venting taking place via the auxiliary channels during the connection of the mirror parts.

The first connecting surface of the first mirror part and/or the second connecting surface of the second mirror part may have a curvature. All cooling channels can be arranged at an approximately identical distance from the optical surface of the mirror. The second mirror part can be formed with a substantially constant thickness. The curvature can correspond to the curvature of the optical surface of the mirror. In particular, one of the connecting surfaces can be convexly curved and the other can be concavely curved. In particular, the convex curvature can be more pronounced than the concave curvature in this case, that is to say for example can have a mean radius of curvature with a smaller absolute value. Locally sequential optical contact bonding can be ensured, because the spacing between the two connecting surfaces increases as the distance from the optical contact bond front increases. The risk of undesirable optical contact bonding at a distance from the optical contact bond front can be reduced. Furthermore, the risk of gas inclusions can be reduced.

The curvature of the first connecting surface of the first mirror part can be formed such that it has different mean radii of curvature and is non-rotationally symmetric, and/or the curvature of the second connecting surface of the second mirror part can be formed such that it has different mean radii of curvature and is non-rotationally symmetric.

The first mirror part and the second mirror part can continue to be brought together along a direction in which the first connecting surface of the first mirror part and/or the second connecting surface of the second mirror part has/ have the mean radius of curvature with the smallest absolute value. Accordingly, optical contact bonding can be carried out along the mean radius of curvature with the smallest absolute value. This can be desirable with respect to bringing the connecting surfaces together and with respect to venting.

There is also the possibility that the first mirror part has a first connecting surface which is formed in a planar manner or has a mean radius of curvature with a large absolute value, in particular a mean radius of curvature with an absolute value of more than 10 m, along at least one direction. Then a thin second mirror part can be used, in particular a second mirror part with a thickness of 0.5 mm to 10 mm, which has a second connecting surface formed in a planar manner. Such a thin second mirror part can mean that its second connecting surface can be deformed and, as a result, adapted to the shape of the first connecting surface of the first mirror part. This can mean that the outlay for the production of a second mirror part with a curved second connecting surface can be dispensed with.

A region for a formation of an optical surface may be provided on a surface of the second mirror part that lies opposite the second connecting surface. The cooling channel openings may be arranged in each case with the greatest part of their longitudinal extent laterally within this region. This can help make efficient cooling of the region that has a particularly great influence on a temperature-induced deformation of the optical surface possible. The auxiliary channel openings can lie in each case with the greatest part of their longitudinal extent laterally outside the region for the formation of the optical surface.

Furthermore, the cooling channels may extend parallel to the optical surface. This can help make particularly uniform cooling of the optical surface possible. In particular, the cooling channels may extend to the optical surface to within a distance of 1 to 6 mm. The shape deviation between the second connecting surface of the second mirror part and the optical surface may be at most 3 mm, such as no more than 20 μm.

After optical contact bonding, the first mirror part and the second mirror part can be connected to one another by way of bonding. Bonding can permit a very strong and permanent connection that can be established with acceptable outlay. Using bonding, the material of the first mirror part can be directly connected to the material of the second mirror part. In this way, certain disadvantages that can occur when using adhesives can be avoided. In particular, bonding can bring about covalent bonds between the material of the first mirror part and the material of the second mirror part.

In an aspect, the disclosure furthermore relates to a mirror of a lithography system. In an aspect, a mirror according to the disclosure has a first mirror part, a second mirror part, an optical surface for reflecting light, a plurality of cooling channels and a plurality of auxiliary channels. The first mirror part and the second mirror part are rigidly connected to one another in the region of a first connecting surface of the first mirror part and a second connecting surface of the second mirror part. The cooling channels have elongate cooling channel openings in the region of the first connecting surface or the second connecting surface. The auxiliary channels have elongate auxiliary channel openings in the region of the first connecting surface or the second connecting surface.

A mirror according to the disclosure can be comparatively easy to produce and may have hardly any gas inclusions between the first and the second connecting surface.

At least some of the cooling channel openings can lie in each case with the greatest part of their longitudinal extent within the lateral region of the optical surface, and at least some of the auxiliary channel openings can lie in each case with the greatest part of their longitudinal extent outside the lateral region of the optical surface.

Furthermore, at least some of the cooling channel openings and at least some of the auxiliary channel openings can have substantially identical orientations. The cooling channel openings and the auxiliary channel openings can in particular have substantially identical orientations at least in pairs.

The cooling channels and the auxiliary channels can be fluidically separated from one another.

The auxiliary channels can be fluidically connected to the environment of the mirror. This allows pressure equalization in the auxiliary channels. The auxiliary channels can also be formed so as to be fluidically separated from the environment of the mirror. In this way, contaminants can be prevented from entering the auxiliary channels and/or from passing from the auxiliary channels into the environment and, for example, contaminating the optical surface. In particular, the auxiliary channels can be separated from the environment of the mirror by way of a flexible membrane, which can help make at least partial pressure equalization between the auxiliary channels and the environment possible.

It is furthermore possible for the auxiliary channels to be isolated in terms of pressure from the environment of the mirror. In such an embodiment, it is possible to control the pressure in the auxiliary channels and in this way to implement a pressure-controlled manipulator.

The first mirror part may have a greater thickness than the second mirror part. This can make efficient cooling of the optical surface and, at the same time, a great mechanical stability of the mirror possible.

Alternatively or additionally, the mirror can have one or more of the optional parameters disclosed for the method according to the disclosure and/or other features.

The disclosure furthermore relates to an illumination system having a mirror according to the disclosure.

The disclosure additionally relates to a projection lens having a mirror according to the disclosure.

Further, the disclosure relates to a lithography system having an illumination system according to the disclosure and/or a projection lens according to the disclosure.

BRIEF DESCRIPTION OF THE DRAWINGS

The disclosure will be explained in more detail below on the basis of the exemplary embodiments that are illustrated in the drawing, in which.

DETAILED DESCRIPTION

Figure 1:
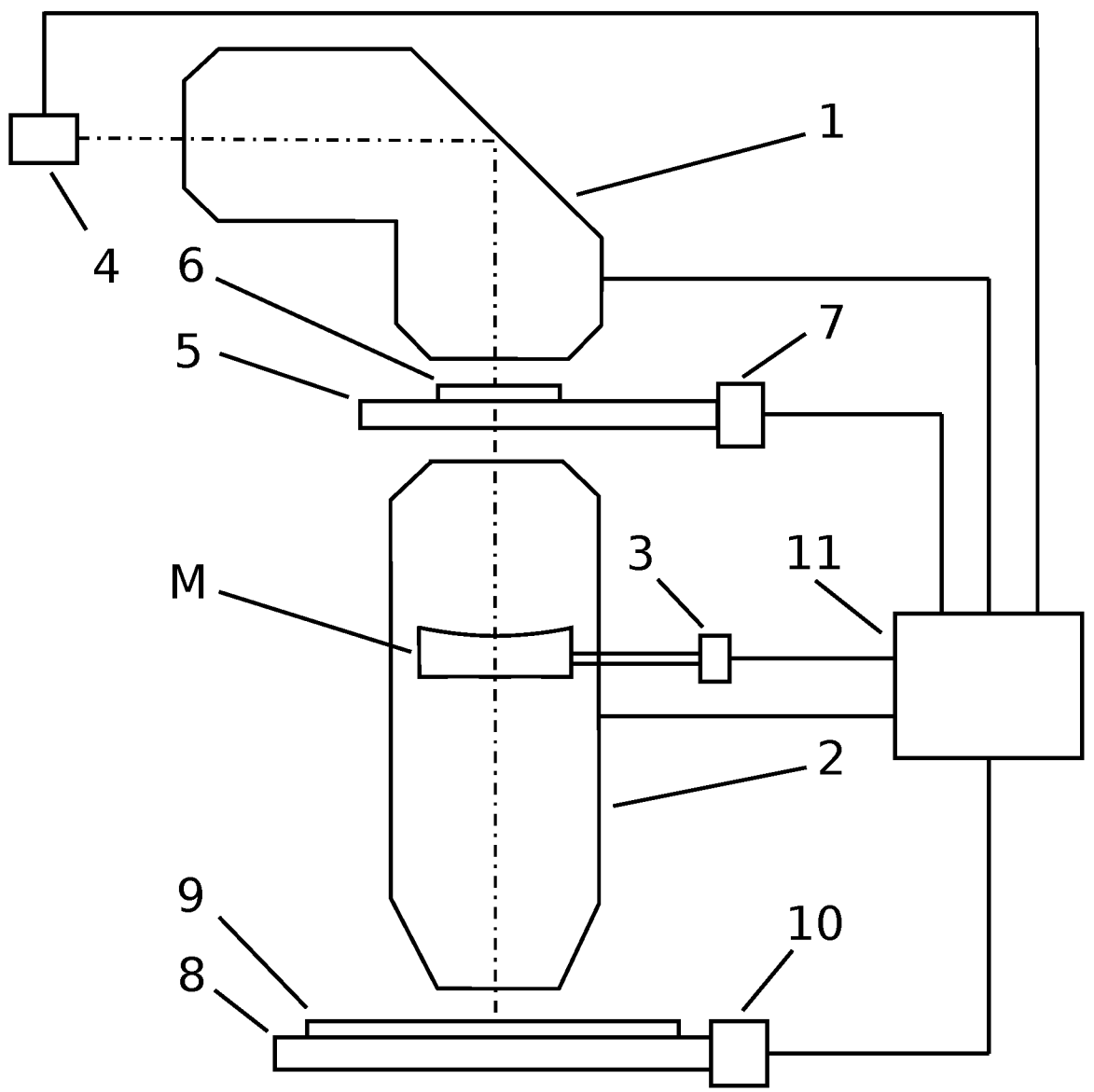
FIG. 1 shows a schematic illustration of an exemplary embodiment of a lithography system according to the disclosure.

FIG. 1 shows a schematic illustration of an exemplary embodiment of a lithography system embodied according to the disclosure. The lithography system illustrated is designed for operation with light in the DUV range. DUV denotes here "deep ultraviolet". In particular, the lithography system may be designed for operation with light at the wavelength of 193 nm.

The lithography system has an illumination system 1 and a projection lens 2. The internal structure of the illumination system 1 and the internal structure of the projection lens 2, which may in each case comprise for example optical components, sensors, manipulators etc., are not shown in detail. In the case of the projection lens 2, a mirror M is indicated as a representative of the optical components of the former. The mirror M may be cooled with the aid of a cooling medium, which is provided by a cooling device 3. The cooling medium is a fluid, for example water. In addition or alternatively, the illumination system 1 may have a cooled mirror M and an associated cooling device 3. The projection lens 2 and/or the illumination system 1 may also have a plurality of cooled mirrors M and cooling devices 3. For example, lens elements and further mirrors-cooled or uncooled—may be present as further optical components in the illumination system 1 and in the projection lens 2.

The light used for the operation of the lithography system is generated by a light source 4. The light source 4 may be in particular an excimer laser, for example an argon fluoride laser, which generates light of the wavelength 193 nm.

Arranged between the illumination system 1 and the projection lens 2 is a reticle stage 5, fixed on which is a mask 6, also referred to as a reticle. The reticle stage 5 has a drive 7. Arranged downstream of the projection lens 2, seen in the direction of light, is a substrate stage 8, which carries a substrate 9, for example a wafer, and has a drive 10.

Also furthermore shown in FIG. 1 is a control device 11, which is connected to the illumination system 1, the projection lens 2, the cooling device 3, the light source 4, the reticle stage 5, or the drive 7 thereof, and the substrate stage 8, or the drive 10 thereof.

The lithography system serves to image the mask 6 onto the substrate 9 with great precision. For this purpose, the mask 6 is illuminated with the aid of the illumination system 1 and the illuminated mask 6 is imaged onto the substrate 9 with the aid of the projection lens 2. Specifically, the following procedure is adopted:

The illumination system 1 transforms the light generated by the light source 4 in an exactly defined way via its optical components and guides it onto the mask 6. Depending on the embodiment, the illumination system 1 may be formed in such a way that it illuminates the entire mask 6 or only a partial region of the mask 6. The illumination system 1 is capable of illuminating the mask 6 in such a way that there are almost identical light conditions at each illuminated point of the mask 6. In particular, the light intensity and the angular distribution of the incident light are almost identical for each illuminated point of the mask 6.

The illumination system 1 is capable of illuminating the mask 6 optionally with light of a multiplicity of different angular distributions. These angular distributions of the light are also referred to as illumination settings. The desired illumination setting is generally selected in dependence on the structure elements formed on the mask 6. Used relatively often for example are dipole or quadrupole illumination settings, in the case of which the light is incident on each illuminated point of the mask 6 from two or from four different directions, respectively. Depending on the form of the illumination system 1, the different illumination settings may be produced for example via different diffractive optical elements in combination with a zoom axicon optical unit or via mirror arrays, which have in each case a multiplicity of small mirrors that are arranged next to one another and are individually adjustable with respect to their angular positions.

The mask 6 may be formed for example as a glass plate, which is transparent to the light supplied by the illumination system 1 and applied to which are opaque structures, for example in the form of a chromium coating.

The lithography system may be formed in such a way that the entire mask 6 is illuminated at the same time by the illumination system 1 and is imaged completely onto the substrate 9 by the projection lens 2 in a single exposure step.

Alternatively, the lithography system may also be formed in such a way that only a partial region of the mask 6 is illuminated at the same time by the illumination system 1 and the drive 7 of the reticle stage 5 is controlled by the control device 11 in such a way that, during the exposure of the substrate 9, the mask 6 is moved relative to the illumination system 1 and, as a result, the illuminated partial region migrates over the mask 6 as a whole. The substrate 9 is moved synchronously by a suitably matched control operation of the drive 10 of the substrate stage 8, in which the imaging properties of the projection lens 2 are also taken into account, and the respectively illuminated partial region of the mask 6 is thus imaged onto a partial region of the substrate 9 that is provided therefor. This movement of the mask 6 and of the substrate 9 is also referred to as scanning.

In order to be able to transfer the latent image produced by the exposure of the substrate 9 in both embodiment variants of the lithography system into a physical structure, a light-sensitive layer is applied to the substrate 9. The image of the mask 6 is formed in this light-sensitive layer by exposure and a permanent structure can be produced therefrom on the substrate 9 with the aid of subsequent chemical processes.

The mask 6 is generally imaged onto the substrate 9 not only once, but multiple times one next to the other. For this purpose, after each imaging of the mask 6 onto the substrate 9, the substrate stage 8 is displaced laterally in a way corresponding to the size of the image of the mask 6 on the substrate 9. The imaging of the mask 6 may be performed here in each case as a whole or sequentially by scanning. The chemical treatment of the substrate 9 is started only when the desired number of imagings of the mask 6 onto the substrate 9 have been carried out.

Figure 2:
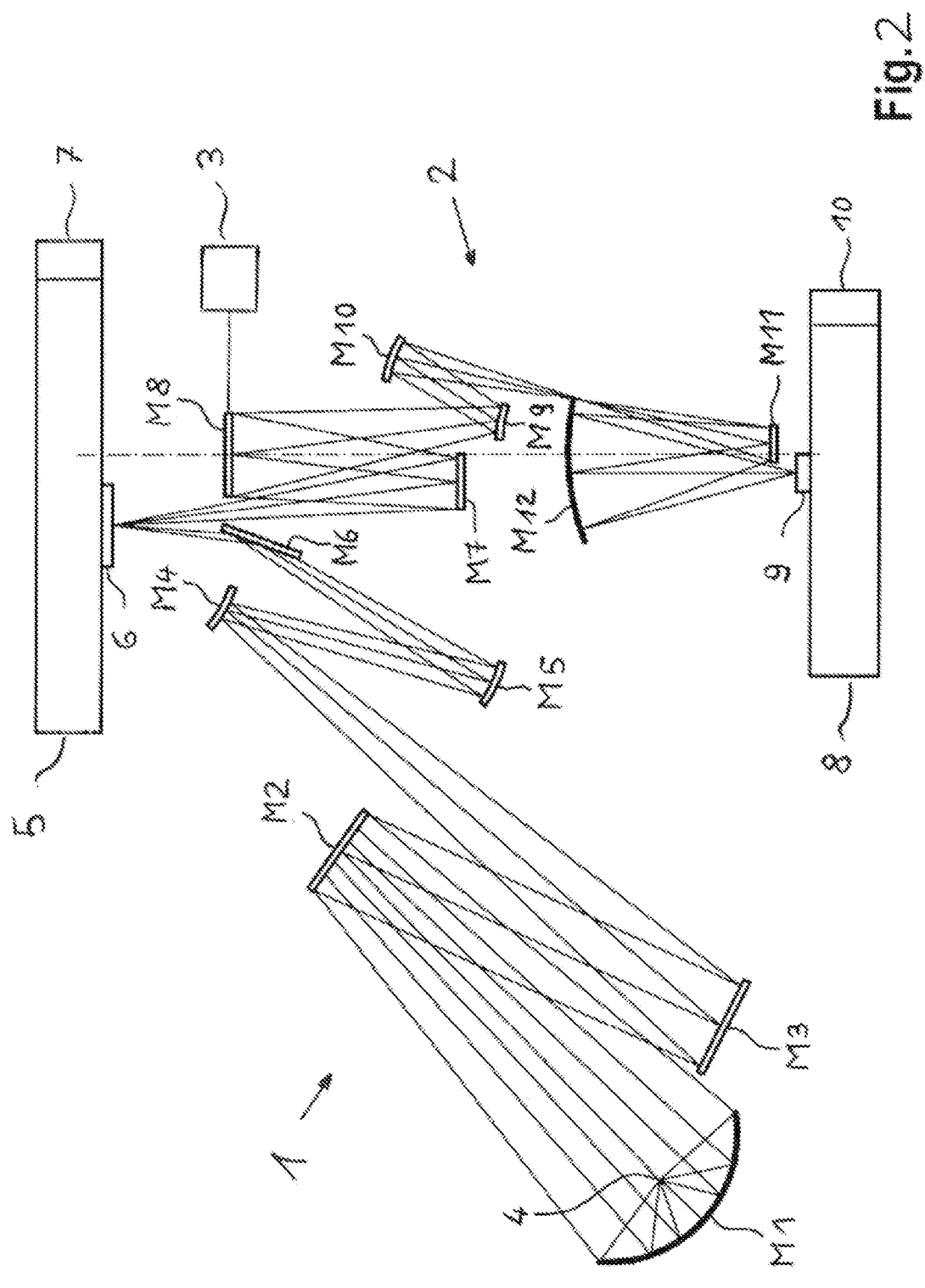
FIG. 2 shows a schematic illustration of a further exemplary embodiment of a lithography system according to the disclosure.

FIG. 2 shows a schematic illustration of a further exemplary embodiment of a lithography system embodied according to the disclosure. The lithography system according to FIG. 2 is designed for operation with light in the EUV range. EUV denotes "extreme ultraviolet". In particular, the lithography system may be designed for operation with light at the wavelength 13.5 nm.

Analogously to the lithography system in FIG. 1, the lithography system illustrated in FIG. 2 has an illumination system 1, a projection lens 2, a light source 4, a reticle stage 5 including drive 7 and a substrate stage 8 including drive 10. The light source 4 can be embodied in particular as a plasma light source. A mask 6 is arranged on the reticle stage 5. A substrate 9 is arranged on the substrate stage 8. The illumination system 1 has mirrors M1, M2, M3, M4, M5 and M6, which are arranged in this order in the beam path from the light source 4 to the mask 6. The projection lens 2 has in the beam path from the mask 6 to the substrate 9, in this order, mirrors M7, M8, M9, M10, M11 and M12. The mirror M8, for example, can be cooled with the aid of a cooling medium provided by a cooling device 3. The cooling medium is again a fluid, for example water. In addition or alternatively to the mirror M8, it is also possible for another mirror of the projection lens 2 and/or of the illumination system 1 to be cooled or for a plurality of mirrors of the projection lens 2 and/or of the illumination system 1 to be cooled.

In the exemplary embodiment of FIG. 2, neither the illumination system 1 nor the projection lens 2 has lens elements, because there are no materials that exhibit a transmission or other optical properties that is or are suitable for a lithography system at a wavelength of 13.5 nm. The mask 6 is also not operated in transmission but in reflection.

Although this is not illustrated in FIG. 2, a control device 11 may be provided in the exemplary embodiment of FIG. 2, similar to the exemplary embodiment of FIG. 1.

The exposure operation is effected in the exemplary embodiment of FIG. 2 in a similar manner to the one described for the exemplary embodiment of FIG. 1, wherein a scanning operation is generally performed.

Figures 3, 4, 5:
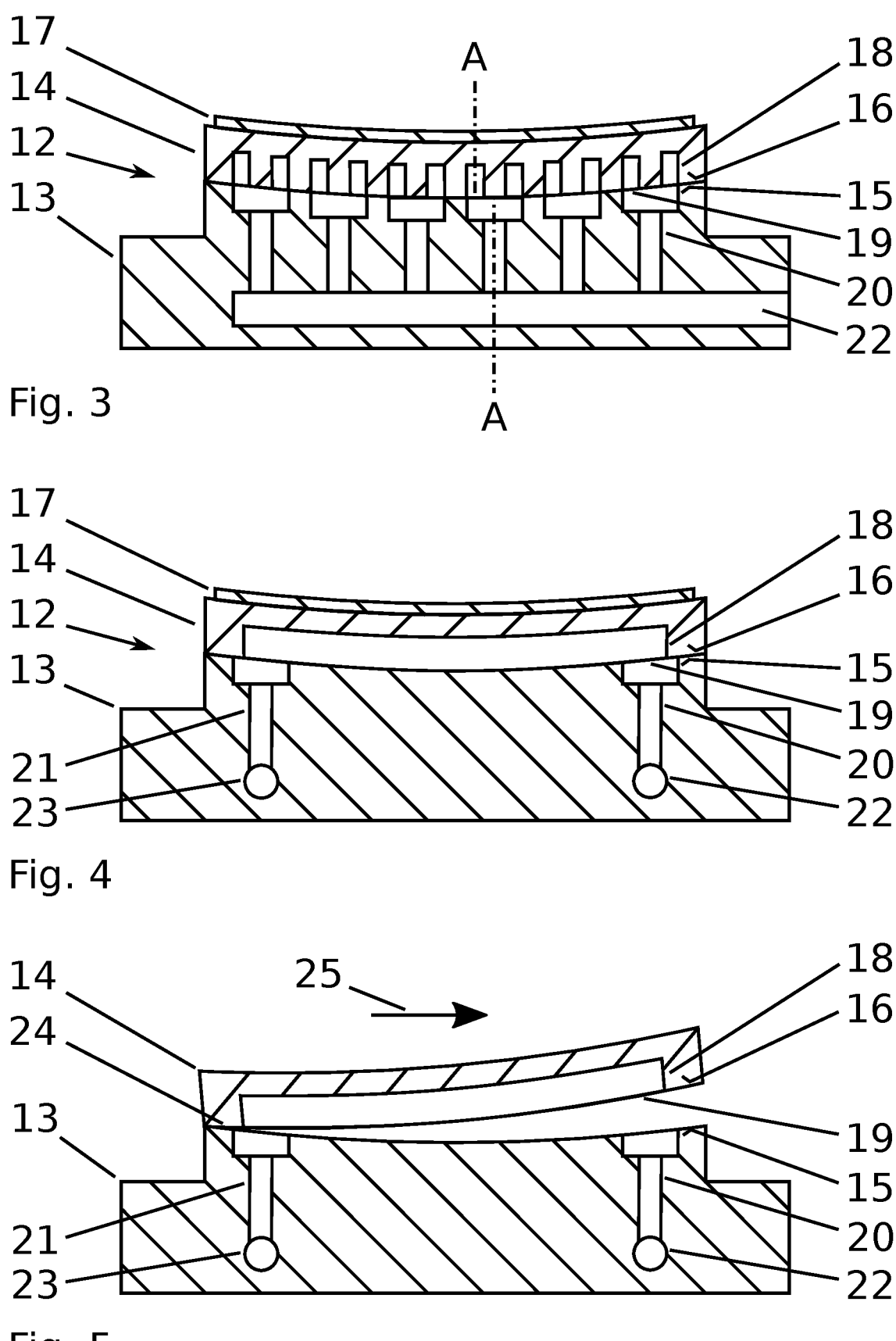
FIG. 3 shows a schematic sectional illustration of an exemplary element of a mirror that has been produced by the method according to the disclosure.
FIG. 4 shows a further schematic sectional illustration of the first exemplary embodiment of the mirror illustrated in FIG. 3.
FIG. 5 shows a snapshot during the optical contact bonding of the upper part onto the lower part in a schematic sectional illustration analogously to FIG. 4.

FIG. 3 shows a schematic sectional illustration of an exemplary embodiment of a mirror 12 produced by the method according to the disclosure. FIG. 4 shows the same exemplary embodiment of the mirror 12 in a further schematic sectional illustration, in which the section is taken along a sectional line A-A depicted in FIG. 3. To be able to illustrate as many details of the mirror 12 as possible, the sectional line A-A has a lateral offset as it passes through the mirror 12. In FIGS. 3 and 4, the illustration of the mirror 12 and its integral parts is not to scale and is highly abstract in order to present the disclosure as clearly as possible. This also applies to all the other figures.

The mirror 12 can be used in one of the lithography systems shown in FIGS. 1 and 2 and has a lower part 13 and an upper part 14, which are in each case produced from quartz glass, Ti-doped quartz glass or a glass ceramic. The terms "lower part" and "upper part" have been chosen because the lower part 13 is generally formed much thicker than the upper part 14 and consequently carries the upper part 14, as it were. The terms do not, however, have anything to do with the orientation of the mirror 12 in relation to the direction of gravitational force in the mounted state of the mirror 12. During the operation of the lithography system, the upper part 14 may be arranged above or below or alongside the lower part 13 with respect to the direction of gravitational force or assume some other relative position with respect thereto. The lower part 13 is also referred to as the first mirror part 13 and the upper part 14 is also referred to as the second mirror part 14.

The lower part 13 and the upper part 14 are rigidly connected to one another in the region of a connecting surface 15 of the lower part 13 and a connecting surface 16 of the upper part 14 via the method according to the disclosure described in more detail below. In the exemplary embodiment shown, the connecting surface 15 of the lower part 13 is formed in a concavely curved manner. The curvature may be formed spherically, aspherically or according to a freeform surface. The connecting surface 16 of the upper part 14 is curved in a way that is complementary to the connecting surface 15 of the lower part 13, and accordingly has a convex curvature, which may be formed spherically, aspherically or according to a freeform surface. Consequently, the connecting surface 16 of the upper part 14 and the connecting surface 15 of the lower part 13 can rest against one another in close contact. As an alternative to a curved formation, the connecting surface 15 of the lower part 13 and the connecting surface 16 of the upper part 14 may also be formed in a planar manner.

On the side that is facing away from its connecting surface 15 and is shown at the bottom in FIG. 3, the lower part 13 is formed in a planar manner. On the side that is facing away from its connecting surface 16 and is shown at the top in FIG. 3, the upper part 14 is formed in a concavely curved manner and has a reflective optical surface 17 with an identical curvature. The curvature may be formed spherically, aspherically or according to a freeform surface and in particular may correspond to the curvature of the connecting surface 16 of the upper part 14. As an alternative to this, it is also possible that the optical surface 17 is formed in a planar manner. This is the case in particular if the connecting surface 15 of the lower part 13 and the connecting surface 16 of the upper part 14 are formed in a planar manner.

The optical surface 17 is embodied as a coating applied to the upper part 14. The formation of the coating depends on the wavelength at which the optical surface 17 is intended to produce its reflective effect. In the case of a desired reflection in the DUV range, i.e. in the case of the mirror M of FIG. 1, the coating may be formed as an aluminium layer. If, on the other hand, a reflection in the EUV range is intended, as in the case for example of the mirror M8 of FIG. 2, the coating may be formed in particular from alternately successive layers of silicon and molybdenum and possibly one or more further layers of a different composition, which serve for example as protective layers.

The upper part 14 furthermore has a plurality of elongate cooling channels 18, which run parallel to one another and to the optical surface 17 and extend laterally in the region of the optical surface 17 and possibly somewhat beyond it. Accordingly, the cooling channels 18 in the case of the exemplary embodiment shown are formed in a curved manner. The cooling channels 18 extend up to the optical surface 17 to within a distance of about 1 to 6 mm and are formed as open towards the connecting surface 16 of the upper part 14. Accordingly, the cooling channels 18 have elongate cooling channel openings 19 in the region of the connecting surface 16 of the upper part 14. The transverse dimensions of the cooling channels 18 may be about 0.2 to 10 mm, wherein the depth of the cooling channels 18, i.e. the dimension approximately perpendicular to the connecting surface 16 of the upper part 14, is generally considerably greater than the width, i.e. the dimension approximately parallel to the connecting surface 16 of the upper part 14. For example, the depth of the cooling channels 18 may be more than twice the width of the cooling channels 18.

In the case of a formation of the connecting surface 16 of the upper part 14 that is not rotationally symmetric, it may have different mean radii of curvature for different azimuth angles or, to put it another way, with respect to different directions. In this case, the direction in which the absolute value of the mean radius of curvature is the smallest can extend parallel to the longitudinal extents of the cooling channel openings 19. In principle, it is also possible that said direction extends transversely to the longitudinal extents of the cooling channel openings 19. Mutually adjacent regions of the connecting surface 15 of the lower part 13 and the connecting surface 16 of the upper part 14 may in the unconnected state have slightly different mean radii of curvature, wherein the mean radius of curvature of the region of the convexly formed surface generally has a smaller absolute value than the mean radius of curvature of the corresponding region of the concavely formed surface. In the case of different radii of curvature in different directions, for each direction separately:

The lower part 13 has a plurality of distributor channels 20 and collector channels 21, which extend starting from the connecting surface 15 of the lower part 13 in the direction of the side of the lower part 13 facing away from the connecting surface 15 into the lower part 13. Inside the lower part 13, the distributor channels 20 open out into a fluid distributor 22 and the collector channels 21 open out into a fluid collector 23. The distributor channels 20 and the collector channels 21 widen in each case in a step-shaped manner towards the connecting surface 15 of the lower part 13 and respectively overlap there with the opposite ends of two cooling channel openings 19. In other words, one distributor channel 20 respectively overlaps with one end of two cooling channel openings 19, and one collector channel 21 respectively overlaps with the two other ends of the same two cooling channel openings 19. Accordingly, one distributor channel 20 is fluidically connected at its one end to the fluid distributor 22 and at its other end to two cooling channels 18. By analogy, one collector channel 21 is fluidically connected at its one end to the fluid collector 23 and at its other end to two cooling channels 18.

It is consequently possible to supply a fluid, for example water, to the cooling channels 18 through the fluid distributor 22 and to the distributor channels 20, wherein each distributor channel 20 respectively supplies two cooling channels 18 and the fluid distributor 22 supplies all of the distributor channels 20 with fluid. The fluid flows through the cooling channels 18 and then flows on via the collector channels 21 into the fluid collector 23, via which it can be removed. In this case, the fluid of every two cooling channels 18 flows respectively into one collector channel 21, and the fluid of all the collector channels 21 flows into the fluid collector 23. The supply of the fluid to the fluid distributor 22 and the removal of the fluid from the fluid collector 23 can take place with the aid of the cooling device 3, which for this purpose can be connected to the fluid distributor 22 and the fluid collector 23.

Adjusting the temperature of the supplied fluid to a temperature below the temperature of the upper part 14 can achieve the effect that the fluid extracts heat from the upper part 14 as it flows through the cooling channels 18. This extraction of heat is intended in particular to compensate for the input of heat due to the light that is incident on the optical surface 17 during the operation of the lithography system. Since the optical surface 17 does not completely reflect the incident light, part of the light is absorbed by the optical surface 17 and, depending on the formation of the optical surface 17, also by the upper part 14 and converted into heat. Since the optical surface 17 and the upper part 14 have a certain thermal conductivity, part of this heat is guided to the cooling channels 18 and can be taken up there by the fluid and transported away. In this way, the rise in temperature of the mirror 12 caused by the light can be limited and the deformation of the optical surface 17 caused by effects of thermal expansion can be reduced in comparison with an uncooled mirror 12. As a consequence, the imaging aberrations caused by the deformation are also reduced.

The formation and arrangement of the cooling channels 18, the distributor channels 20, the collector channels 21, the fluid distributor 22 and the fluid collector 23 may be modified in various ways. For example, the cooling channels 18 may be arranged in the lower part 13 and be formed as open towards the connecting surface 15 of the lower part 13, and so the cooling channels 18 have elongate cooling channel openings 19 in the region of the connecting surface 15 of the lower part 13. It may also be desirable for the distributor channels 20 and the collector channels 21, and the fluid distributor 22 and the fluid collector 23 to be connected directly to the cooling channels 18 etc.

For producing the mirror 12, the lower part 13 and the upper part 14 are produced as separate parts and then connected to one another. The optical surface 17 is generally formed only after connecting the lower part 13 and the upper part 14 in order to achieve the highest possible precision, in particular with respect to its shape, and to avoid damage to the optical surface 17 during the connecting process. A material with a very low coefficient of thermal expansion is used for the manufacturing of the lower part 13 and the upper part 14. Suitable materials are for example quartz glass, quartz glass doped with titanium oxide or special glass ceramics. The lower part 13 and the upper part 14 may be cut out from a common material blank. However, there is also the possibility of using different material blanks for the lower part 13 and the upper part 14 if they do not differ too much from one another with respect to their material parameters.

For example, a quartz glass which is mixed with titanium oxide and has a zero crossing temperature averaged over the volume of the lower part 13 of between 22 and 25° C., may be used for the production of the lower part 13. The zero crossing temperature has been adjusted here to match the expected temperature of the lower part 13, taking into account the cooling of the mirror 12, during the operation of the lithographic system. Depending on the method for producing the material used for the lower part 13, the increase in the coefficient of thermal expansion at 22° C. can be less than about 1.35 to 1.8 ppb/K2.

The lower part 13 is cut out from the material blank and then worked by grinding and polishing. The connecting surface 15 of the lower part 13 here may in particular be brought into a shape that corresponds approximately to the intended shape of the optical surface 17, which is formed at a later time on the upper part 13. The shape deviation between the connecting surface 15 of the lower part 13 and the optical surface 17 is at most 3 mm, such as no more than 200 μm. If the connecting surface 15 of the lower part 13 has a circular peripheral border, its diameter is generally between 20 and 100 cm with a sag of up to 3% of the diameter. A spherical basic form of the connecting surface 13 of the lower part 13 may be overlaid with any desired function, and so a freeform surface can be obtained.

With respect to a wavelength λ of 633 nm used for the measurement, the polishing of the connecting surface 15 of the lower part 13 may take place with a deviation from a specified shape (figure) of less than λ/2, such as less than λ/10. Furthermore, a roughness of less than 5 nm, such as less than 1 nm, may be achieved in this case. The term "roughness" in this case subsumes the randomly distributed deviations from a smooth surface. Shape or figure deviations are considered to comprise both longwave deviations from the specified shape and shortwave, and more point-like, not randomly distributed deviations. The longwave shape deviation may also be somewhat greater than the aforementioned values of λ/2 and λ/10. With respect to the shortwave deviation, the values mentioned are however maintained wherever possible. For example, deviations with spatial frequencies of several cm do not have such a disruptive effect. Deviations with spatial frequencies below 100 μm are generally much more disruptive. If the final connection of the lower part 13 and the upper part 14 as part of a bonding process takes place at very high temperatures, in particular at temperatures of above 1000° C., the desired properties with respect to roughness and shape deviations can be relaxed somewhat and the connecting surface 15 of the lower part 13 can alternatively be worked by lapping. Depending on the material of the lower part 13, the desired temperatures can also be 1200° C. or more.

In order to avoid drying in of remains of grinding and polishing agents, the lower part 13 is rinsed off directly after the grinding and polishing. Furthermore, mechanical wet cleaning may be carried out. The surface of the lower part 13 may be additionally cleaned with solvents, organic and inorganic cleaning agents or via a plasma treatment etc.

When working the lower part 13, it is to be ensured that damage at depth is avoided, because small amounts of water, other process agents such as for example polishing agents or contaminants, can be left behind in micro cracks and they may evaporate away and lead to local blistering when the lower part 13 is heated up. To avoid or eliminate possible damage at depth, dry and/or wet etching steps or other suitable optical working steps may be used. Furthermore, graduated grinding steps may be used, or contactless removal performed, for example by etching with oxygen plasma, which may be followed by a polishing step. Freedom from damage at depth is demonstrated for example by briefly etching with fluoric acid, this not leading to local etch pits. A fluoric acid bath is suitable at the same time as a cleaning step for removing hydrocarbons.

After the grinding and polishing or lapping, if applicable the distributor channels 20 and the collector channels 21 as well as the fluid distributor 22 and the fluid collector 23 are formed in the lower part 13. Depending on the formation of the lower part 13, the cooling channels 18 may be formed in the lower part 13. The distributor channels 20 and the collector channels 21 as well as the fluid distributor 22 and the fluid collector 23 generally have transverse dimensions, i.e. dimensions transverse to the direction of flow of the fluid, that are much greater than the corresponding dimensions of the cooling channels 18.

The respective channels may be formed by milling, grinding, drilling, laser ablation, ultrasound ablation or etching or a combination of these methods. As a last method step, etching with fluoric acid may be provided in each case, in order to avoid later crack propagation and to form a surface in the channels that is only slightly roughened in a way that is conducive to flow.

In order to protect the already worked, in particular polished, surface of the lower part 13 from breakouts at the edges, for example at the peripheries of the cooling channel openings 19, and from similar damage, a protective resist may be applied to the surface of the lower part 13 before the forming of the channels. Any breakouts at the edges that occur in spite of this precautionary measure may be smoothed out locally or eliminated by a bevel running for example around the cooling channel openings 19. However, this bevel can be undesirable in terms of flow and in terms of strength because of the notch effect and should be avoided as far as possible.

As an alternative to the procedure described above, there is the possibility of first forming the channels in the lower part 13 and only then working the surface of the lower part 13 by grinding, lapping and/or polishing This however results in a certain rounding at the edges of the cooling channel openings 19 or other openings, because for example the polishing disks have a finite stiffness and bulge into the cooling channel openings 19 or other openings. This rounding at the edges can be counteracted by inserting or cementing in placeholders of the same material as the lower part 13 into the cooling channel openings 19 or other openings. The placeholders are ground away and polished together with the connecting surface 15 of the lower part 13 and reduce the widths of the gaps caused by the cooling channel openings 19 or other openings. The gaps remaining between the placeholders and the surrounding material of the lower part 13 may also be grouted with a glass-or ceramic-powder-filled putty, and so during the polishing there is at most slight bulging, and accordingly very little rounding at the edges. Alternatively, local reworking may take place via robot polishing or ion beam polishing in order to minimize the rounding at the edges After the working of the surface of the lower part 13, the placeholders, and if applicable the grouting material, are removed again.

In order to avoid, or at least reduce, rounding at the edges, ablating or etching methods may be used as an alternative to mechanical surface working If, within these methods, a resist mask is applied to the regions that are not to be worked, underetching may occur in the peripheral regions of the resist mask. The adverse effects of this underetching can be counteracted by suitable mechanical, laser-ablative or etching reworking.

A material with identical or similar properties as described for the lower part 13 may be used for the production of the upper part 14. The material properties of the upper part 14 may only deviate within specified limits from the material properties of the lower part 13. After the cutting out of the upper part 14 from the material blank, the surface of the upper part 14, in particular the connecting surface 16, may be worked in an analogous way to that described for the lower part 13, and analogous desired properties with respect to shape deviation and roughness have to be met. As has been described for the lower part 13, the desired properties with respect to roughness and shape deviations can be relaxed somewhat and the connecting surface 16 of the upper part 14 can be worked by lapping if the final connection of the lower part 13 and the upper part 14 takes place as part of a bonding process at very high temperatures, in particular temperatures of above 1000° C. or above 1200° C. Relaxing the desired properties is possible also if the upper part 14 is comparatively thin and also for longwave shape deviations.

Depending on the variant of the embodiment, the upper part 14 may have cooling channels 18 and/or other channels, such as for example distributor channels 20 and collector channels 21. All of these channels can be produced in an analogous way to that described for the lower part 13 and analogous measures can be used for reducing the rounding at the edges etc.

The upper part 14 generally has a thickness of between 10 and 40 mm, but under certain preconditions may also have a smaller thickness. Depending on the thickness, it may be desirable to cement or optically contact bond the upper part 14 onto a glass substrate as a carrier material for working, in order to achieve a stiffness sufficient for precise working. Tools that have the same or very similar nominal curvature as the tools for working the connecting surface 15 of the lower part 13 may be used for the working of the connecting surface 16 of the upper part 14 by grinding, lapping and/or polishing. Optionally, a further step may be provided after that, in which the actual shapes of the connecting surface 15 of the lower part 13 and the connecting surface 16 of the upper part 14 are measured and the connecting surface 16 of the upper part 14 is locally adapted to the connecting surface 15 of the lower part 13 by robot polishing, plasma etching, ion beam ablation or compacting high-energy irradiation.

In the case of embodiments of the mirror 12 in which the connecting surface 15 of the lower part 13 is substantially plane or has a very small curvature, and so the absolute value of the mean radius of curvature for at least one azimuth angle is greater than 10 m, there is the possibility of using a comparatively thin upper part 14, which has a thickness of 0.5 to 10 mm, and of forming the connecting surface 16 of the upper part 14 in a planar manner. In this case, the upper part 14 may be deformed as it is being connected to the lower part 13, and as a result the connecting surface 16 of the upper part 14 may be adapted to the shape of the connecting surface 15 of the lower part 13. For the working involved before the connection, the upper part 14 may be cemented onto a sufficiently stiff carrier material or be optically contact bonded onto the carrier material.

As an alternative to the use of an upper part 14 cut out from a material blank, a thin upper part 14 of titanium-doped quartz glass may also be produced by flowing out, for example on molten metal (float glass), pouring over a long break-away edge, pressing and sintering of glass soot or indirectly by way of a grey body. These methods can mean that the upper part 14 is produced from a sheet a few millimetres thick, in which good homogeneity with respect to the material parameters can be achieved, and that it may be possible to dispense with mechanical working. To be able to achieve similar thermal expansion behaviour as in the case of the lower part 13 with an upper part 14 from such a sheet, the OH content of the sheet should deviate by at most 5% and the titanium content of the sheet should deviate by at most 0.05% from the respective content of the lower part 13. In the case of very thin sheets from which upper parts 14 with thicknesses of less than 2 mm are produced, these desired properties can be relaxed a little further.

When the working of the lower part 13 and the upper part 14 has finished, they can be connected to one another in the region of their connecting surfaces 15, 16. The connection is performed in two steps: In a first step, the upper part 14 is optically contact bonded onto the lower part 13, i.e. is brought so close to the lower part 13 that it adheres to the lower part 13 as a result of the Van-der-Waals forces between the atoms of the lower part 13 and the atoms of the upper part 14. In a second step, the connection between the upper part and the lower part is strengthened via a bonding process, by which covalent bonds are formed between the atoms of the lower part 13 and the atoms of the upper part 14, and so the upper part 14 and the lower part 13 are permanently connected very strongly to one another.

Before the optical contact bonding, the lower part 13 and the upper part 14 are cleaned, activated and dried, in particular in the region of their connecting surfaces 15, 16. For example, the connecting surface 15 of the lower part 13 and the connecting surface 16 of the upper part 14 may be simultaneously cleaned, ablated and activated by etching, for example with fluoric acid, by sputtering or by plasma treatment, in particular with hydrogen or oxygen plasma.

For being optically contact bonded onto the lower part 13, the connecting surface 16 of the upper part 14 is brought so close to the connecting surface 15 of the lower part 13 that a strong attraction occurs as a result of the Van-der-Waals forces between the atoms near the surface of the upper part 14 and the atoms near the surface of the lower part 13 and ultimately connects the upper part 14 and the lower part 13 to one another. Since the Van-der-Waals forces only act over very short distances, it can be desirable to bring the connecting surface 16 of the upper part 14 and the connecting surface 15 of the lower part 13 very close together. Within a relatively large surface area this is possible only if the connecting surface 16 of the upper part 14 and the connecting surface 15 of the lower part 13 are very smooth, have almost exactly the same shape and are largely free from contaminants. For this reason, the above-described preparations are made before the optical contact bonding so as to create optimum conditions for the optical contact bonding process.

Air or other gas inclusions between the connecting surface 16 of the upper part 14 and the connecting surface 15 of the lower part 13 can impede the bringing together of the connecting surfaces 16, 15 and also have a negative effect for the later use of the mirror 12. For this reason, measures are taken as part of the method according to the disclosure that make it easier for air or another gas to escape from the intermediate space between the connecting surface 16 of the upper part 14 and the connecting surface 15 of the lower part 13 during the optical contact bonding of the upper part 14 onto the lower part 13 and largely prevent gas inclusions.

One of these measures involves the manner in which the connecting surface 16 of the upper part 14 and the connecting surface 15 of the lower part 13 are brought together. This will be explained in greater detail with reference to FIG. 5.

FIG. 5 shows a snapshot during the optical contact bonding of the upper part 14 onto the lower part 13 in a schematic sectional illustration analogously to FIG. 4. In the case of the exemplary embodiment shown, the connecting surface 15 of the lower part 13 and the connecting surface 16 of the upper part 14 have at least approximately complementary curvatures. As can be seen from FIG. 5, the connecting surface 16 of the upper part 14 is not brought up to the connecting surface 15 of the lower part 13 in parallel alignment over the full surface area, but instead the connecting surfaces 15, 16 form an angle with one another when they are brought together and initially only meet one another in the region of their peripheral surfaces shown on the left in FIG. 5. In FIG. 5, the angle is exaggerated in order that the effect can be seen. As the connecting surfaces are brought together, initially there is only contact between the upper part 14 and the lower part 13 in a small region of the connecting surfaces 15, 16, and so initially only a comparatively small contact surface 24 is formed between the upper part 14 and the lower part 13. Van-der-Waals forces produce their attractive effect within the contact surface 24 in a manner such that optical contact bonding of the connecting surface 16 of the upper part 14 onto the connecting surface 15 of the lower part 13 occurs in the region of the contact surface 24.

The upper part 14 is then successively pivoted further towards the lower part 13 and thereby brought ever closer to it, and consequently the contact surface 24 increases in size. Accordingly, the surface area within which the upper part 14 is optically contact bonded onto the lower part 13 also increases. The linearly formed transition between the optically contact bonded region of the connecting surfaces 15, 16 and the non-optically contact bonded region of the connecting surfaces 15, 16 will be referred to below as the optical contact bond front. In the illustration of FIG. 5, the optical contact bond front extends perpendicularly to the plane of the drawing. This applies at least in the region where the optical contact bond front intersects the plane of the drawing. The optical contact bond front may be formed as a straight line or slightly curved and, as the upper part 14 is brought closer to the lower part 13, moves from the left to the right, i.e. the approach of the upper part 14 to the lower part 13 progresses successively from the left to the right. The progressive approach is also referred to hereafter as "rolling", and in the illustration of FIG. 5 the upper part 14 is thus rolled up to the lower part 13 from the left to the right. The direction of the rolling movement is illustrated in FIG. 5 by an arrow and is referred to below as the rolling direction 25.

The successive optical contact bonding with a steadily migrating, linear optical contact bond front has the effect that the gas is successively displaced out of the intermediate space between the connecting surface 16 of the upper part 14 and the connecting surface 15 of the lower part 13, and as a result the risk of gas inclusions is reduced considerably. The optical contact bonding operation is ended when the connecting surface 16 of the upper part 14 has been optically contact bonded onto the connecting surface 15 of the lower part 13 over the full surface area.

In the case of exemplary embodiments in which the connecting surface 16 of the upper part 14 and the connecting surface 15 of the lower part 13 are not formed in a rotationally symmetric manner, the connecting surface 16 of the upper part 14 can be rolled up to the connecting surface 15 of the lower part 13 parallel to a direction in which the connecting surfaces 15, 16 have the greatest absolute value of the mean radius of curvature.

The escape of the gas from the intermediate space between the connecting surface 16 of the upper part 14 and the connecting surface 15 of the lower part 13 can be made even easier to some extent by the connecting surface 16 of the upper part 14 and the connecting surface 15 of the lower part 13 not having exactly the same curvature. This will be explained in greater detail with reference to FIG. 6.

As can be seen from FIG. 5, the rolling direction 25 runs parallel to the longitudinal extent of the cooling channel openings 19. Consequently, the cooling channels 18 are continuously vented during the entire optical contact bonding operation, which reduces the risk of gas inclusions considerably. This will be explained in greater detail with reference to FIG. 7. A further positive effect of the rolling parallel to the longitudinal extent of the cooling channel openings 19 involves the fact that the upper part 14 can be continuously supported by the lower part 13 during the rolling, and the optical contact bond front can advance continuously and without jumps that could be caused by transverse cooling channel openings 19. As a result, uncontrolled optical contact bonding and any material stresses caused thereby can be prevented.

Figure 6:
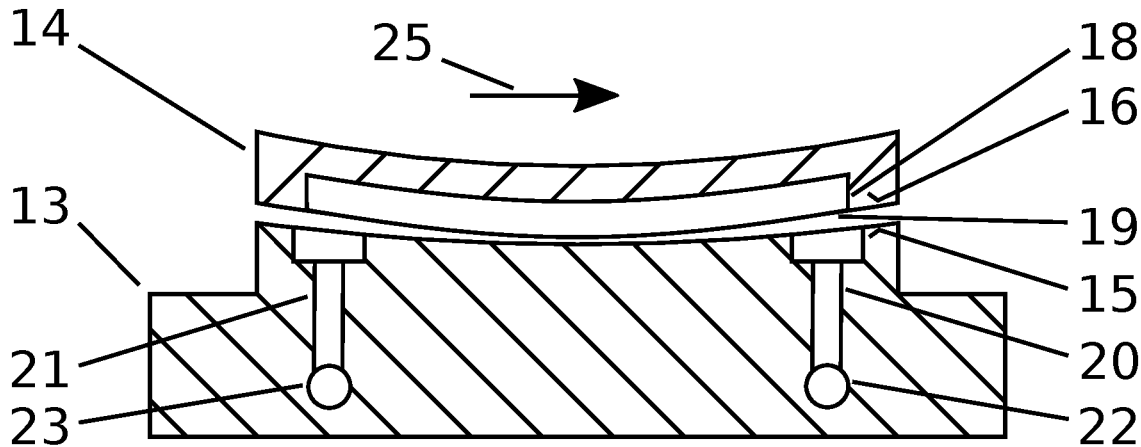
FIG. 6 shows a schematic sectional illustration of an upper part and a lower part analogously to FIG. 4.

FIG. 6 shows a schematic sectional illustration of an upper part 14 and a lower part 13 analogously to FIG. 4. The upper part 14 is shown with a very small distance from and parallel orientation with respect to the lower part 13. However, this does not represent a snapshot during the optical contact bonding but serves for illustrating the geometry of the connecting surface 16 of the upper part 14 and the connecting surface 15 of the lower part 13. Nevertheless, the upper part 14 and the lower part 13 are shown in their relative azimuthal rotational orientations during the optical contact bonding, and the sectional plane of the illustration extends parallel to the rolling direction 25 during the optical contact bonding.

It is apparent from FIG. 6 that the connecting surface 15 of the lower part 13 is formed so as to be curved, in particular, concavely curved. The connecting surface 16 of the upper part 14 is the opposite of the connecting surface 15 of the lower part 13 and thus formed so as to be convexly curved. It is further apparent from FIG. 6 that the connecting surface 16 of the upper part 14 has in the sectional plane of FIG. 6 and thus in a direction parallel to the rolling direction 25 a more pronounced curvature than the connecting surface 15 of the lower part 13. In other words, the connecting surface 16 of the upper part 14 has, with respect to said direction, a mean radius of curvature with a smaller absolute value than the connecting surface 15 of the lower part 13. The difference in curvatures is exaggerated in FIG. 6, because it would not be discernible otherwise.

The different curvatures of the connecting surface 16 of the upper part 14 and the connecting surface 15 of the lower part 13 have the result that, when the upper part 14 is rolled up to the lower part 13, a wedge-shaped gap remains continuously between the connecting surface 16 of the upper part 14 and the connecting surface 15 of the lower part 13 beyond the optical contact bond front, via which gap the gas between the connecting surface 16 of the upper part 14 and the connecting surface 15 of the lower part 13 can escape. Such a constellation is present whenever it is that one of the connecting surfaces 15, 16 that is convexly curved that has a mean radius of curvature with a smaller absolute value than that one of the connecting surfaces 15, 16 that is concavely curved.

Figure 7:
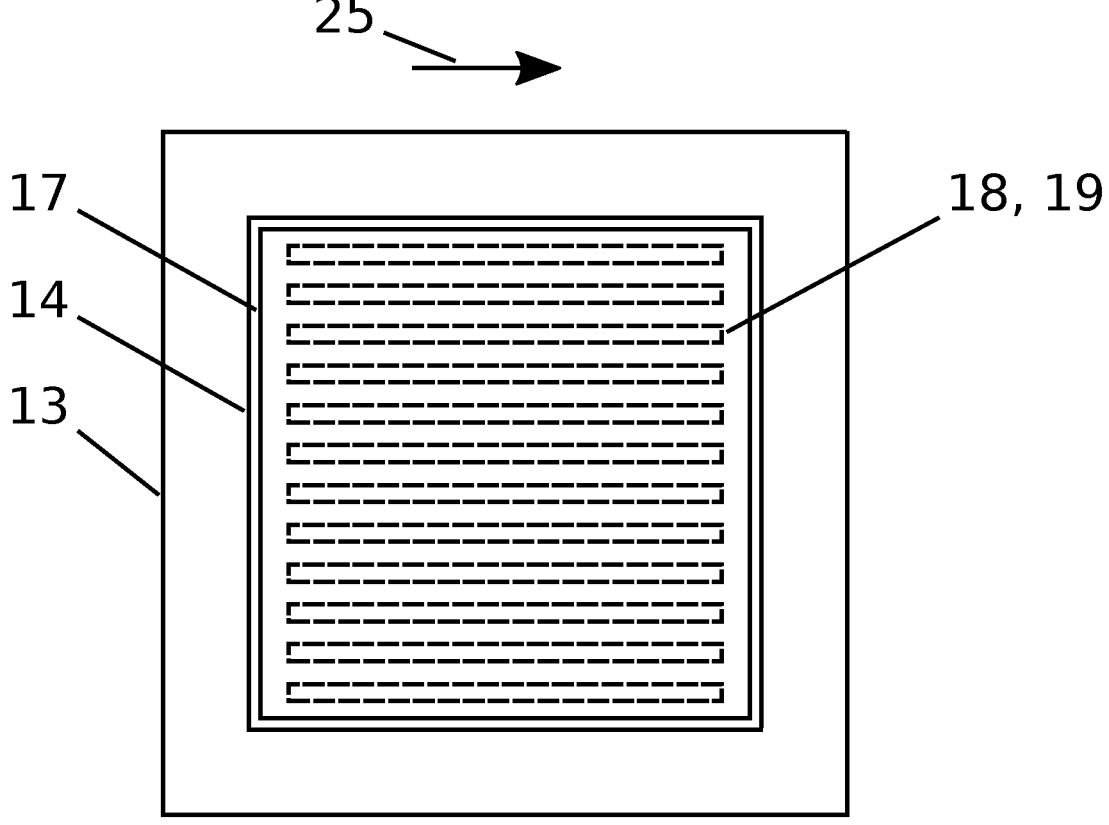
FIG. 7 shows a snapshot during the optical contact bonding of the upper part onto the lower part in a schematic top view.

FIG. 7 shows a snapshot during the optical contact bonding of the upper part 14 onto the lower part 13 in a schematic top view. In a different situation than in FIG. 5, the position of the optical surface 17 is drawn in FIG. 7, although the optical surface 17 is generally formed only after the optical contact bonding. The formation of the lower part 13, the upper part 14 and the optical surface 17, which formation is rectangular viewed from the top, was chosen by way of example because it is possible in this way to very illustratively show large-area coverage of the connecting surface 16 of the upper part 14 with cooling channels 18, that is to say a distribution of the cooling channels 18 over nearly the entire lateral region of the connecting surface 16 of the upper part 14. The connecting surface 16 of the upper part 14 is not directly visible in FIG. 7. However, FIG. 7 shows the upper part 14, which carries the connecting surface 16 and of which the outer contour in the illustrated exemplary embodiment matches the peripheral border of the connecting surface 16. The actual shapes of the lower part 13, the upper part 14 and the optical surface 17 can deviate in each case from the illustration of FIG. 7 and be dependent for example on the optical and mechanical situation, the available installation space and so on.

In the illustration of FIG. 7, the rolling direction 25 runs from the left to the right. In FIG. 7, the left periphery of the connecting surface 16 of the upper part 14 is initially brought up to the periphery of the connecting surface 15 of the lower part 13 illustrated on the left in FIG. 7 until the connecting surface 16 of the upper part 14 and the connecting surface 15 of the lower part 13 come into contact. Then, the connecting surface 16 of the upper part 14 is rolled up to the connecting surface 15 of the lower part 13 from the left to the right and is consequently successively optically contact bonded onto it, that is to say the optical contact bond front extends from the left and right in the illustration of FIG. 7. As is furthermore apparent from FIG. 7, the cooling channels 18, which are arranged in the upper part 14 and are formed as open towards the connecting surface 16 of the upper part 14, and in particular the longitudinal extents of the cooling channel openings 19 extend parallel to the rolling direction 25.

Optical contact bonding of the upper part 14 onto the lower part 13 with a rolling direction 25 parallel to the longitudinal extent of the cooling channel openings 19 makes it much easier for gas to escape out of the intermediate space between the connecting surface 16 of the upper part 14 and the connecting surface 15 of the lower part 13, since the cooling channel openings 19 offer an additional possibility for venting which reduces the risk of gas inclusions. This effect is particularly pronounced if the cooling channels 18, as in the case of the exemplary embodiment of FIG. 7, extend over nearly the entire lateral region of the connecting surface 16 of the upper part 14. Even if a gas inclusion occurs temporarily due to imperfectly sequential optical contact bonding, the chances that at least one of the cooling channel openings 19 is arranged at least partially in the region of the gas inclusion such that the enclosed gas can escape via the cooling channel opening 19 are good. In order to design this venting as efficiently as possible, the clear distance between the cooling channel openings 19 is not more than 15 mm, such as not more than 5 mm.

Figure 8:
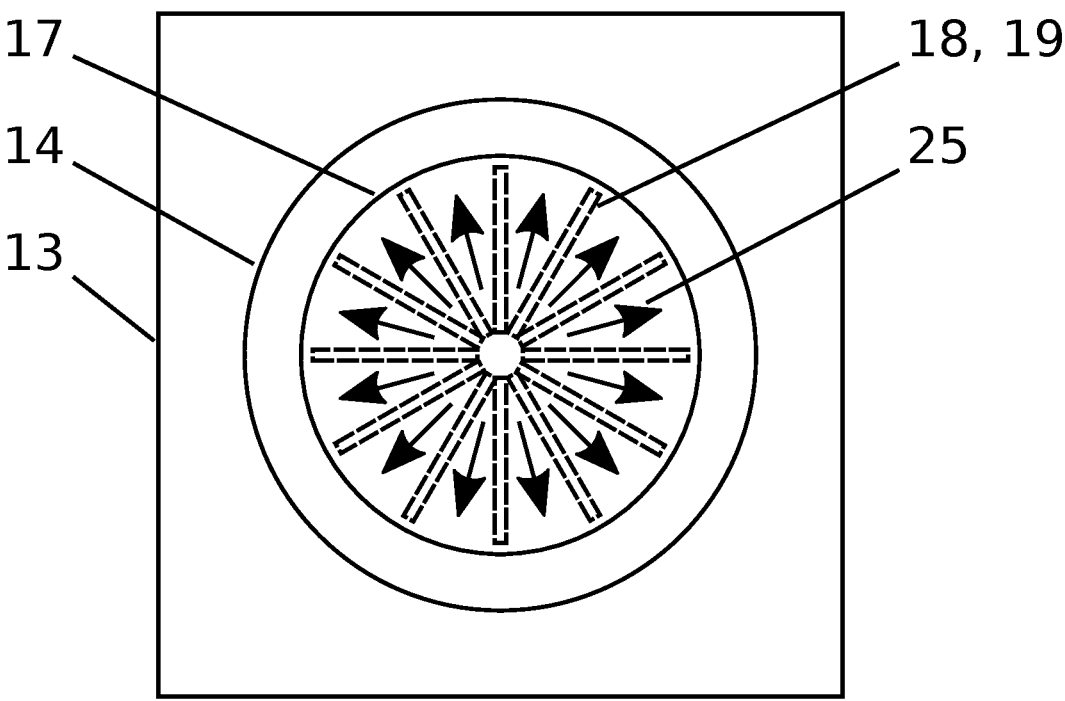
FIG. 8 shows a further snapshot during the optical contact bonding of the upper part onto the lower part in an illustration corresponding to FIG. 7.

FIG. 8 shows a further snapshot during the optical contact bonding of the upper part 14 onto the lower part 13 in an illustration corresponding to FIG. 7. The snapshot according to FIG. 8 differs from the snapshot according to FIG. 7 in a different configuration of the upper part 14 and of the lower part 13. The upper part 14 illustrated in FIG. 7 has a shape that is rectangular viewed from the top and has mutually parallel cooling channels 18 and cooling channel openings 19. The cooling infrastructure of the lower part 13 is adapted to this geometry. By contrast, the upper part 14 illustrated in FIG. 8 has an outer contour that is circular viewed from the top and has cooling channels 18 and cooling channel openings 19 that extend radially outwardly from the lateral position of the centre of the region intended for the optical surface 17. The cooling infrastructure of the lower part 13 is again adapted to this geometry. For easier orientation, the outlines of the optical surface 17 are drawn, even though the optical surface 17 is not formed until a later point in time.

According to FIG. 8, the connecting surface 16 of the upper part 14 and the connecting surface 15 of the lower part 13 are initially brought together, as part of the optical contact bonding operation, in the lateral region of the centre of the optical surface 17 until contact is achieved and the contact surface 24 is formed. To prevent uncontrolled optical contact bonding, the connecting surface 16 of the upper part 14 can have a more pronounced curvature than the connecting surface 15 of the lower part 13. Consequently, the contact surface 24 is initially limited to the centre and its immediate vicinity. Owing to the differing curvatures of the connecting surface 16 of the upper part 14 and of the connecting surface 15 of the lower part 13, the spacing between the connecting surfaces 15, 16 increases as the distance from the centre increases so that optical contact bonding does not yet occur there.

Next, the connecting surface 16 of the upper part 14 is pressed against the connecting surface 15 of the lower part 13 in regions extending successively radially outwardly from the centre, with the result that the contact surface 24 increases in size radially outwardly and the connecting surface 16 of the upper part 14 is thereby optically contact bonded onto the connecting surface 15 of the lower part 13 in a concentrically increasing area until, ultimately, an optical contact bond over the full area has been achieved. In the process, an optical contact bond front that moves radially outwardly from the centre is formed. This is indicated by the arrows for the rolling direction 25. Since the optical contact bond front moves parallel to the cooling channels 18 and in particular to the longitudinal extents of the cooling channel openings 19, the gas can easily escape from the region between the connecting surface 16 of the upper part 14 and the connecting surface 15 of the lower part 13, as a result of which gas inclusions can be avoided.

Generally, the cooling channels 18 and the cooling channel openings 19 are arranged only within a region in the upper part 14 or lower part 13 that is arranged laterally within the optical surface 17 in the finished mirror 12, wherein a slight overrun, that is to say a slight extent outside this region, is possible Areas from which the gas can escape less well, and which therefore represent a greater risk of gas inclusions, may thus remain on the connecting surface 16 of the upper part 14 and the connecting surface 15 of the lower part 13 laterally outside the region of the optical surface 17. Such an area in FIG. 8 is the annular space radially between the outer contour of the optical surface 17 and the outer contour of the upper part 14. The risk of gas inclusions within this annular space or in other areas without cooling channel openings 19 can be reduced by a further measure, which will be described on the basis of FIG. 9.

Figure 9:
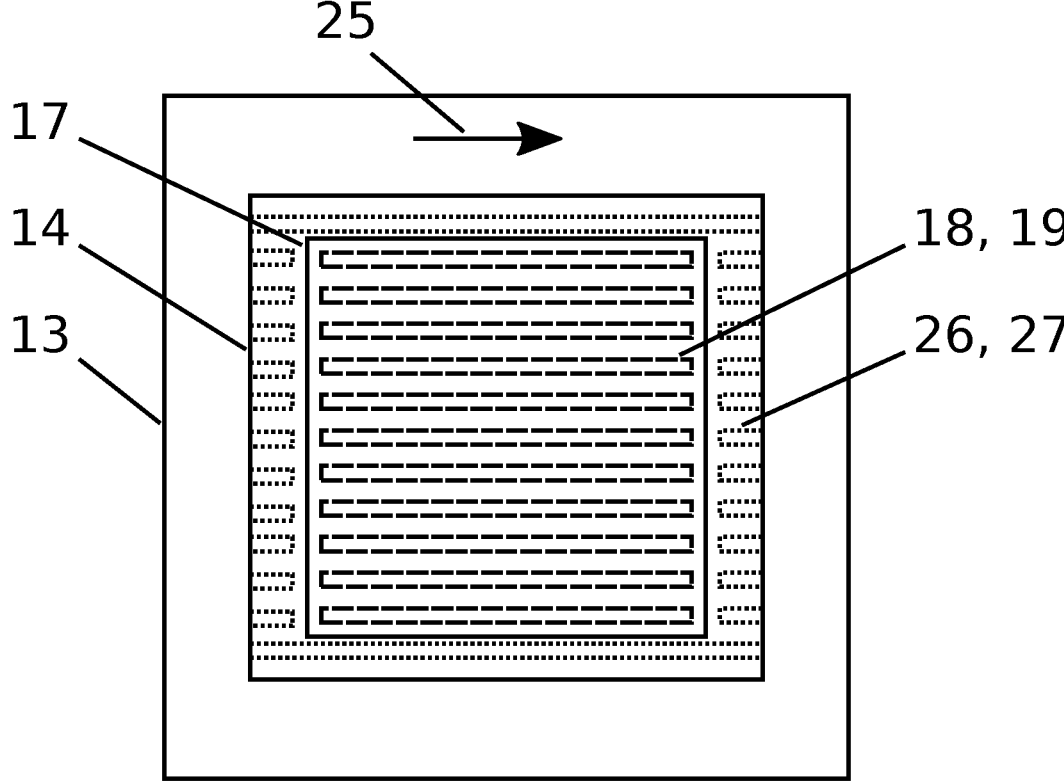
FIG. 9 shows a further snapshot during the optical contact bonding of the upper part onto the lower part in an illustration corresponding to FIG. 7.

FIG. 9 shows a further snapshot during the optical contact bonding of the upper part 14 onto the lower part 13 in an illustration corresponding to FIG. 7. For easier orientation, the outlines of the optical surface 17 are drawn, even though the optical surface 17 is not formed until a later point in time. The snapshot according to FIG. 9 shows an upper part 14 with a rectangular outer contour and differs from the snapshot according to FIG. 7 in that the optical surface 17 has much smaller lateral dimensions than the upper part 14 and in that the upper part 14 has auxiliary channels 26 in addition to the cooling channels 18.

Since the cooling channels 18 extend only within the lateral region of the optical surface 17, a region without cooling channels 18 and without cooling channel openings 19 remains in the intermediate space between the optical surface 17 and the outer contour of the upper part 14. The auxiliary channels 26 are arranged in this region. The auxiliary channels 26 are arranged within the upper part 14 completely or mostly laterally outside the region intended for the optical surface 17 and are open towards the connecting surface 16 of the upper part 14, with the result that elongate auxiliary channel openings 27 are formed in the connecting surface 16. The direction of the longitudinal extent of the auxiliary channel openings 27 corresponds to the direction of the longitudinal extent of the cooling channel openings 19 and extends parallel to the rolling direction 25. The clear spacings between the auxiliary channel openings 27 are at most as large as the clear spacings between the cooling channel openings 19. The auxiliary channels 26 have the same function as the cooling channels 18 during the optical contact bonding operation, to be precise that of making the removal of the gas between the connecting surface 15 of the lower part 13 and the connecting surface 16 of the upper part 14 easier and avoiding gas inclusions. Accordingly, if possible all the regions of the connecting surface 16 of the upper part 14 that have no cooling channels 18 are provided with auxiliary channels 26.

The auxiliary channels 26 can be produced in a similar manner as the cooling channels 18 and are formed separately from the cooling channels 18 and are not fluidically connected to the cooling channels 18. The auxiliary channels 26 are fluidically connected to the environment. This can be achieved for example by the auxiliary channels 26 being formed as open towards the side surfaces of the upper part 14 or being vented via holes in the lower part 13 that open out into the connecting surface 15 of the lower part 13 and extend completely through the lower part 13. Before the mirror 12 is mounted in a lithography system, the auxiliary channels 26 are thoroughly cleaned, for example by etching and multiple flushing operations.

As an alternative to the formation of a fluidic connection with the environment, it is also possible to close up the auxiliary channels 26. In a variant, the auxiliary channels 26 are closed up by a flexible membrane, which allows a certain pressure equalization with the environment. In a further variant, the auxiliary channels 26 are filled with a fluid and closed up in a manner such that it is possible to establish a desired fluid pressure in the auxiliary channels 26 and in this way implement a pressure-controlled manipulator. It is likewise possible for the fluid to be used for additional cooling or heating of the mirror 12. It is additionally possible to introduce a heating wire into the auxiliary channels 26 for heating the mirror 12.

The optical contact bonding operation is started by bringing the connecting surface 16 of the upper part 14 and the connecting surface 15 of the lower part 13 together in the vicinity of their peripheral surfaces shown on the left in FIG. 9 and is continued by a rolling movement proceeding from the left to the right until the connecting surface 16 of the upper part 14 is completely optically contact bonded onto the connecting surface 15 of the lower part 13. This promotes the venting of the region between the connecting surface 16 of the upper part 14 and the connecting surface 15 of the lower part 13 initially through the auxiliary channel openings 27, then through the cooling channel openings 19 and the auxiliary channel openings 27, and finally again through the auxiliary channel openings 27. For the rest, what was stated with respect to FIGS. 7 and 8 applies analogously.

Figure 10:
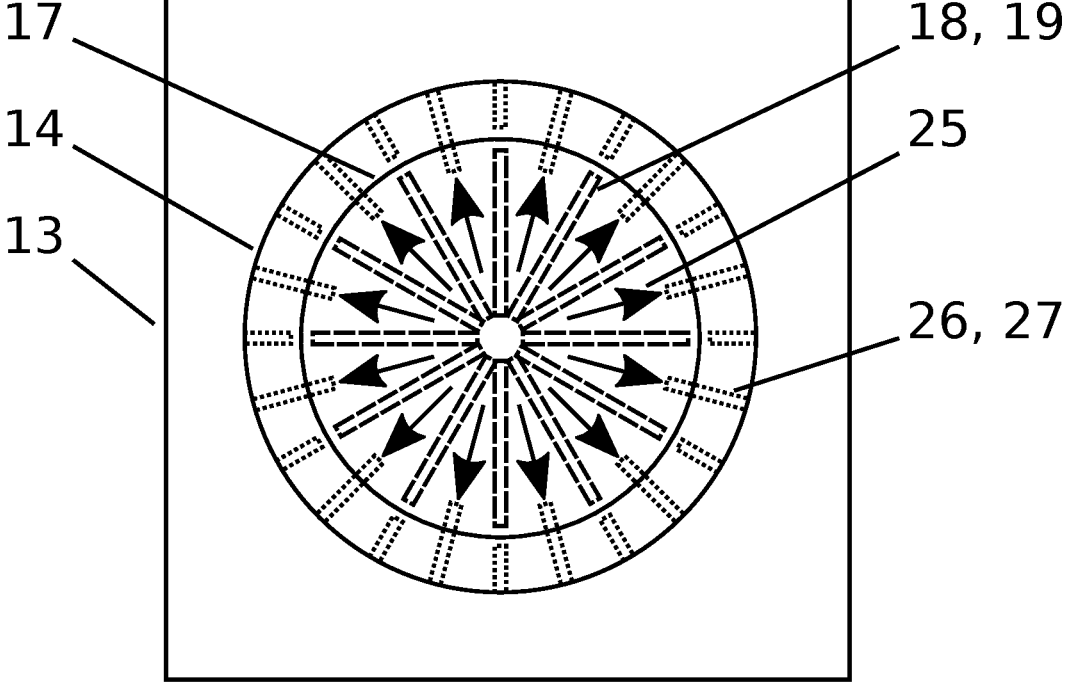
FIG. 10 shows a further snapshot during the optical contact bonding of the upper part onto the lower part in an illustration corresponding to FIG. 7.

FIG. 10 shows a further snapshot during the optical contact bonding of the upper part 14 onto the lower part 13 in an illustration corresponding to FIG. 7. For easier orientation, the outlines of the optical surface 17 are drawn, even though the optical surface 17 is not formed until a later point in time. The snapshot according to FIG. 10 shows an upper part 14 with a circular outer contour and differs from the snapshot according to FIG. 8 in that the upper part 14 has the auxiliary channels 26 in addition to the cooling channels 18. The auxiliary channels 26 are arranged within the upper part 14 laterally outside the region intended for the optical surface 17 and are open towards the connecting surface 16 of the upper part 14, with the result that elongate auxiliary channel openings 27 are formed in the connecting surface 16. The direction of the longitudinal extent of the auxiliary channel openings 27 extends radially outwardly analogously to the direction of the longitudinal extent of the cooling channel openings 19 and thus parallel to the rolling direction 25.

The optical contact bonding operation is started by bringing the connecting surface 16 of the upper part 14 and the connecting surface 15 of the lower part 13 together laterally in the centre of the optical surface 17 and is continued by a rolling movement directed radially outwardly until the connecting surface 16 of the upper part 14 is completely optically contact bonded onto the connecting surface 15 of the lower part 13. This promotes the venting of the region between the connecting surface 16 of the upper part 14 and the connecting surface 15 of the lower part 13 initially through the cooling channel openings 19 and then through the auxiliary channel openings 27. For the rest, what was stated with respect to FIGS. 7, 8 and 9 applies analogously.

The abovementioned statements each relate to exemplary embodiments in which the cooling channels 18 and possibly the auxiliary channels 26 are arranged in the upper part 14 and are formed as open towards the connecting surface 16 of the upper part 14. In exemplary embodiments in which the cooling channels 18 and possibly the auxiliary channels 26 are arranged in the lower part 13 and are formed as open towards the connecting surface 15 of the lower part 13, it is possible to proceed analogously taking into account this difference.

The abovementioned exemplary embodiments can each be modified such that channels extending transversely to the rolling direction 25 are provided at least temporarily in the upper part 14. These channels increase the flexibility of the upper part 14, making it easier for the connecting surface 16 of the upper part 14 to rest closely against the connecting surface 15 of the lower part 13. If said channels are formed as open towards the side of the upper part 14 that is facing away from the connecting surface 16, the channels can be smoothed by way of material ablation before the optical surface 17 is formed.

In all variants of the embodiment, the intermediate products produced can be subjected, after the optical contact bonding of the upper part 14 onto the lower part 13, to a bonding process. As part of the bonding process, the intermediate product is subjected to heat treatment, wherein the upper part 14 and the lower part 13 can optionally be pressed against one another. In this way, covalent bonds are formed between atoms in the region of the connecting surface 16 of the upper part 14 and of the connecting surface 15 of the lower part 13, possibly in addition to already existing covalent bonds. This results in increased durability of the connection between the upper part 14 and the lower part 13.

Following the bonding process, the upper part 14 may be worked away to a thickness above the cooling channels 18 of 1 to 10 mm.

After the working step of the thickness reduction of the upper part 14, or instead of this working step, the upper part 14 is reworked in such a way that it has, on its side which is facing away from the connecting surface 16 and on which the optical surface 17 is intended to be formed, a specified shape with high precision and satisfies specified roughness criteria. Then, the optical surface 17 is formed there. This may take place for example by applying an aluminium layer or alternately applying layers of molybdenum and silicon.

REFERENCE SIGNS

1 Illumination system
2 Projection lens
3 Cooling device
4 Light source
Reticle stage
6 Mask
7 Drive
8 Substrate stage
9 Substrate
Drive
11 Control device
12 Mirror
13 Lower part
14 Upper part
Connecting surface
16 Connecting surface
17 Optical surface
18 Cooling channel
19 Cooling channel opening
Distributor channels
21 Collector channels
22 Fluid distributor
23 Fluid collector
24 Contact surface
Rolling direction
26 Auxiliary channel
27 Auxiliary channel opening
M Mirror
M1 Mirror
M3 Mirror
M3 Mirror
M4 Mirror
MS Mirror
M6 Mirror
M7 Mirror
MS Mirror
M9 Mirror
M10 Mirror
M11 Mirror
M12 Mirror

What is claimed is:

1. A method, comprising:
providing first and second mirror parts, the first mirror part comprising cooling channels comprising elongate cooling channel openings in a region of a first connecting surface of the first mirror part, and/or the second mirror part comprising cooling channels comprising elongate cooling channel openings in a region of a second connecting surface of the second mirror part;

bringing together the first and second mirror parts so that initially a partial region of the first connecting surface and a partial region of the second connecting surface come into contact and form a common contact surface; and enlarging the common contact surface by continuing to bring the first and second mirror parts together in a direction along longitudinal extents of the cooling channel openings, wherein:

the method forms a mirror comprising an optical surface;

the first mirror part further comprises auxiliary channels comprising elongate auxiliary channel openings in the region of the first connecting surface;

the cooling channels of the first and/or second mirror part are beneath the optical surface of the mirror; and the auxiliary channels of the first mirror part are not beneath the optical surface of the mirror.

2. The method of claim 1, wherein the first mirror part comprises cooling channels comprising elongate cooling channel openings in the region of the first connecting surface.

3. The method of claim 2, wherein the second mirror part comprises cooling channels comprising elongate cooling channel openings in the region of the second connecting surface.

4. The method of claim 1, wherein the cooling channel openings are parallel to one another.

5. The method of claim 1, wherein each cooling channel opening extends radially outwardly in a direction from a central location of at least one surface selected from the group consisting of the first connecting surface and the second connecting surface.

6. The method of claim 1, wherein there is a clear spacing between adjacent cooling channel openings, and the clear spacing is not more than 15 mm.

7. The method of claim 1, wherein:
the second mirror part further comprises auxiliary channels comprising elongate auxiliary channel openings in the region of the second connecting surface; and
the auxiliary channels of the second mirror part are not beneath the optical surface of the mirror.

8. The method of claim 7, wherein:
the first mirror part comprises cooling channels comprising elongate cooling channel openings in the region of the first connecting surface; and
the second mirror part comprises cooling channels comprising elongate cooling channel openings in the region of the second connecting surface.

9. The method of claim 8, wherein the cooling channel openings are parallel to one another.

10. The method of claim 8, wherein each cooling channel opening extends radially outwardly in a direction from a central location of at least one surface selected from the group consisting of the first connecting surface and the second connecting surface.

11. The method of claim 1, wherein the first connecting surface has a curvature.

12. The method of claim 11, wherein the second connecting surface has a curvature.

13. The method of claim 1, wherein the first connecting surface has a first curvature, the first curvature has different mean radii of curvature for different azimuthal angles, and the first curvature is non-rotationally symmetric.

14. The method of claim 13, wherein the second connecting surface has a second curvature, the second curvature has different mean radii of curvature for different azimuthal angles, and the second curvature is non-rotationally symmetric.

15. The method of claim 1, further comprising forming an optical surface on a surface of the second mirror part that lies opposite to the second connecting surface.

16. The method of claim 1, wherein:

the first mirror part comprises cooling channels comprising elongate cooling channel openings in the region of the first connecting surface;

the auxiliary channels of the first mirror part are fluidically separated from the cooling channels of the first mirror part;

the second mirror part comprises cooling channels comprising elongate cooling channel openings in the region of the second connecting surface;

the second mirror part further comprises auxiliary channels comprising elongate auxiliary channel openings in the region of the second connecting surface; and the auxiliary channels of the second mirror part are fluidically separated from the cooling channels of the second mirror part.

17. A method, comprising:

providing first and second mirror parts, the first mirror part comprising cooling channels comprising elongate cooling channel openings in a region of a first connecting surface of the first mirror part, and/or the second mirror part comprising cooling channels comprising elongate cooling channel openings in a region of a second connecting surface of the second mirror part;

bringing together the first and second mirror parts so that initially a partial region of the first connecting surface and a partial region of the second connecting surface come into contact and form a common contact surface; and enlarging the common contact surface by continuing to bring the first and second mirror parts together in a direction along longitudinal extents of the cooling channel openings, wherein:

the first connecting surface has a curvature;

the second connecting surface has a curvature; and the method further comprises continuing to bring the first and second mirror parts together along a direction in which at least one surface selected from the group consisting of the first connecting surface and the second connecting surface has a mean radius of curvature with the smallest absolute value.

26

18. A method, comprising:

providing first and second mirror parts, the first mirror part comprising cooling channels comprising elongate cooling channel openings in a region of a first connecting surface of the first mirror part, and/or the second mirror part comprising cooling channels comprising elongate cooling channel openings in a region of a second connecting surface of the second mirror part;

bringing together the first and second mirror parts so that initially a partial region of the first connecting surface and a partial region of the second connecting surface come into contact and form a common contact surface; and enlarging the common contact surface by continuing to bring the first and second mirror parts together in a direction along longitudinal extents of the cooling channel openings, wherein the first connecting surface has a first curvature, the first curvature has different mean radii of curvature for different azimuthal angles, and the first curvature is non-rotationally symmetric.

19. A method, comprising:

providing first and second mirror parts, the first mirror part comprising cooling channels comprising elongate cooling channel openings in a region of a first connecting surface of the first mirror part, and/or the second mirror part comprising cooling channels comprising elongate cooling channel openings in a region of a second connecting surface of the second mirror part;

bringing together the first and second mirror parts so that initially a partial region of the first connecting surface and a partial region of the second connecting surface come into contact and form a common contact surface; and enlarging the common contact surface by continuing to bring the first and second mirror parts together in a direction along longitudinal extents of the cooling channel openings, wherein:

the first mirror part further comprises auxiliary channels comprising elongate auxiliary channel openings in the region of the first connecting surface; and the auxiliary channels of the first mirror part are fluidically separated from the cooling channels of the first and/or second mirror part.

20. The method of claim 19, wherein:

the second mirror part further comprises auxiliary channels comprising elongate auxiliary channel openings in the region of the second connecting surface; and the auxiliary channels of the second mirror part are fluidically separated from the cooling channels of the first and/or second mirror part.

* * * * *